(12) United States Patent
Tomassetti et al.

(10) Patent No.: US 11,052,557 B2
(45) Date of Patent: Jul. 6, 2021

(54) HEATING BLADES OF RAZOR USING RF ENERGY

(71) Applicant: Heated Blades Holding Company, LLC, Pompano Beach, FL (US)

(72) Inventors: Louis D. Tomassetti, Pompano Beach, FL (US); Felix Lazarev, Boca Raton, FL (US)

(73) Assignee: HEATED BLADES HOLDING COMPANY, LLC, Pompano Beach, FL (US)

( * ) Notice: Subject to any disclaimer, the term of this patent is extended or adjusted under 35 U.S.C. 154(b) by 0 days.

(21) Appl. No.: 16/580,740

(22) Filed: Sep. 24, 2019

(65) Prior Publication Data

US 2020/0016781 A1 Jan. 16, 2020

Related U.S. Application Data

(63) Continuation-in-part of application No. 15/343,833, filed on Nov. 4, 2016, now abandoned.

(51) Int. Cl.
*B26B 21/48* (2006.01)
*B26B 21/40* (2006.01)
*H01J 37/32* (2006.01)

(52) U.S. Cl.
CPC .......... *B26B 21/48* (2013.01); *B26B 21/4056* (2013.01); *H01J 37/32174* (2013.01)

(58) Field of Classification Search
CPC . B26B 21/48; B26B 21/4056; H01J 37/32174
See application file for complete search history.

(56) References Cited

U.S. PATENT DOCUMENTS

| 2,514,678 | A | * | 7/1950 | Southworth | H01P 1/213 332/163 |
| 3,413,433 | A | * | 11/1968 | Timmermans | H01P 1/00 219/692 |
| 4,209,017 | A | * | 6/1980 | Shaw | A61B 18/00 219/227 |
| 5,669,144 | A | * | 9/1997 | Hahn | B26B 21/60 204/192.15 |
| 8,057,498 | B2 | * | 11/2011 | Robertson | A61B 17/320068 606/169 |

(Continued)

*Primary Examiner* — Ghassem Alie
*Assistant Examiner* — Fernando A Ayala
(74) *Attorney, Agent, or Firm* — Malloy & Malloy, P.L.; Robert M. Downey

(57) ABSTRACT

A razor includes one or more blades that are directly or indirectly heated by RF energy. A control circuit is connected to and operates a high frequency (HF) generator and a HF power amplifier (HFPA) for generating radio frequency (RF) energy throughout a range of controllable power levels. The generated RF energy is guided by a wave guide from the HFPA to a resonance chamber (i.e., band pass filter cavity). The RF energy is radiated from the resonance chamber towards the one or more blades which absorb the RF energy, thereby causing the temperature of the blades to increase. An energy source provides the electric current required for operating the control circuit, the HF generator and the HFPA. In another embodiment, the RF energy is radiated from the resonance chamber towards a heating element that increases in temperature and heats the blades by thermal conduction.

5 Claims, 4 Drawing Sheets

(56) References Cited

U.S. PATENT DOCUMENTS

| | | | |
|---|---|---|---|
| 9,985,299 B1* | 5/2018 | Bar-Gadda | H01M 8/0202 |
| 2006/0026841 A1* | 2/2006 | Freund | B26B 21/4056 |
| | | | 30/32 |
| 2011/0167640 A1* | 7/2011 | Flyash | A61B 18/1402 |
| | | | 30/34.05 |
| 2014/0005701 A1* | 1/2014 | Olson | A61B 17/320092 |
| | | | 606/169 |
| 2018/0126572 A1* | 5/2018 | Tomassetti | B26B 21/48 |

* cited by examiner

HEATING BLADES OF RAZOR USING RF ENERGY

This patent application is a Continuation-In-Part (CIP) of non-provisional patent application Ser. No. 15/343,833 filed on Nov. 4, 2016.

BACKGROUND OF THE INVENTION

Field of the Invention

The present invention relates generally to razors for shaving and, more particularly, to a razor having one or more blades that are heated by RF energy.

Discussion of the Related Art

It is known that the cutting edge of a razor blade cuts hair more effectively when it is warm or hot. It is also common practice to place the razor blades under hot running water in order to heat the blades just prior to stroking the blades over the skin in order to cut the hairs. However, the heat cutting performance of the blades lasts only a short time during the beginning of the shaving stroke. Within seconds, the temperature of the skin surface, hairs and blade are quickly reduced due to exposure to the ambient air. Ideally, it is best to maintain the blades, including the cutting edges of the blades, heated to a warm temperature throughout the shaving process to achieve better performance and increased shaving comfort.

One particular prior art blade heating invention, disclosed in U.S. Pat. No. 6,817,101 B1 to Bohmer, provides a razor with blades that are continuously heated throughout the shaving process. In Bohmer, heating the blades is attained by applying a measured amount of electric current to the blades by means of conductors connected to each side of the blade cartridge and extended in the form of contacts at the connection of the blade cartridge to a razor handle. Electric current is provided by a primary battery contained in a compartment in the razor handle. The electric current passing through the blades results in generation of heat in the blades. The degree of heat can be adjusted by means of resistors connected in series with the blades and the blade cartridge. A switch closes the circuit to allow electric current to flow through the blades.

U.S. Pat. No. 6,836,966 to Patrick discloses a heated razor having heating elements that are bonded to the bottom sides of the blades of the razor. The heating elements are activated by electric current and generate heat that is transferred to the blades by thermal conduction. Patrick requires an electrical connection, by wire conductors, between a battery source in the handle of the razor and the heating elements that are bonded to the blades.

The present invention eliminates the need to have an electrical connection between a battery source in the handle of the razor and the blades or a heating element positioned in contact with or near the blades. Specifically, the present invention uses RF energy generated by a high frequency (HF) generator. The generated RF energy is amplified by a high frequency power amplifier. The RF energy is guided from the HF power amplifier to a resonance chamber by a wave guide. The resonance chamber is structured to radiate the RF energy towards the blades of the razor to heat the blades. Alternatively, the RF energy is radiated towards one or more heating elements that are in direct contact with the blades for transferring heat energy directly to the blades. Accordingly, the present invention overcomes the problems and shortcomings associated with the need to have an electrical connection between a power source in the handle of the razor and the blades or heating element on the blade cartridge.

SUMMARY OF THE INVENTION

The present invention is directed to a razor that includes one or more blades that are directly or indirectly heated by RF energy. A control circuit in the handle of the razor operates a high frequency (HF) generator and a HF power amplifier (HFPA) for generating radio frequency (RF) energy throughout a range of controllable power levels. An energy source provides the electric current required for operating the control circuit, the HF generator and the HF power amplifier. The energy source may include one or more batteries contained in the handle of the razor. The battery source in the handle of the razor can be rechargeable.

In one embodiment, the HF energy is guided from the HFPA via a wave guide into the resonance chamber (i.e., band pass filter cavity), and is radiated from the resonance chamber towards the blades that are made of material with a known Curie temperature. The control circuit measures the Standing Wave Ratio (SWR) and constantly monitors the SWR for changes. As the blades absorb HF energy, they heat up. As the blades' temperature approaches the Curie temperature of the blade material, the electromagnetic properties are changed, thus changing the HF energy absorption rate, which in turn is indicated by a change in the SWR. In response, the control circuit reduces the power of the generated RF energy. As the blades are cooling down, thus moving further away from the Curie temperature, the HF energy absorption rate is increasing, which in turn is indicated by a changed SWR. In response, the control circuit increases the power of the generated RF energy, thereby maintaining the blades at the desired temperature.

In another embodiment, the HF energy is guided from the HFPA via the wave guide into the resonance chamber, and is radiated from the resonance chamber towards one or more heating elements that are made of a material with a known Curie temperature. The one or more heating elements are thermally coupled with blades either by direct contact or via a thermal conductor attached to the one or more heating elements and the blades. The SWR is monitored for changes. As the heating element(s) absorb HF energy, it heats up. As the temperature of the heating element(s) approaches the Curie temperature of the blade material, the electromagnetic properties are changed, thus changing the HF energy absorption rate, which in turn is indicated by a changed SWR. In response, the control circuit reduces the power of the generated RF energy. As the heating element(s) is cooling down, thus moving further away from the Curie temperature, the HF energy absorption rate is increasing, which in turn is indicated by a changed SWR. In response, the control circuit increases the power of the generated RF energy, thereby maintaining the heating element, and by extent the blades, at the desired temperature.

OBJECTS AND ADVANTAGES OF THE INVENTION

Considering the foregoing, it is a primary object of the present invention to provide a wet shave razor for shaving and which includes one or more blades that are heated by RF energy without the need of wire conductors or other physical connections between a power source in the handle and the blade cartridge of the razor.

It is a further object of the present invention to provide a wet shave razor having one or more blades that are directly heated by RF energy to a desired temperature range without the need of wire conductors or other electric contacts between the handle of the razor and the blades and/or blade cartridge.

It is a further object of the present invention to provide a wet shave razor having one or more blades that are indirectly heated by RF energy to a desired temperature range without the need of wire conductors or other electric contacts between the handle of the razor and the blades and/or blade cartridge.

It is still a further object of the present invention to provide a wet shave razor for shaving that includes one or more blades that are heated directly or indirectly by RF energy, and wherein the razor includes a control circuit for monitoring the blade temperature (or heating element temperature) and for controlling the generation and amplification of RF energy for maintaining the blades within the desired temperature range.

It is still a further object of the present invention to provide a wet shave razor for shaving that includes one or more blades that are heated by RF energy, and wherein the razor includes a control circuit and a power storage source, and wherein the control circuit monitors energy levels that are supplied by the power storage source in order to estimate the power limit that is available for disposal.

These and other objects and advantages of the present invention are more readily apparent with reference to the following detailed description and the accompanying drawings.

BRIEF DESCRIPTION OF THE DRAWINGS

For a fuller understanding of the nature of the present invention, reference should be made to the following detailed description taken in conjunction with the accompanying drawings in which.

Like reference numerals refer to like components and parts throughout the several views in the drawings.

DETAILED DESCRIPTION OF THE PREFERRED EMBODIMENTS

Figure 1:
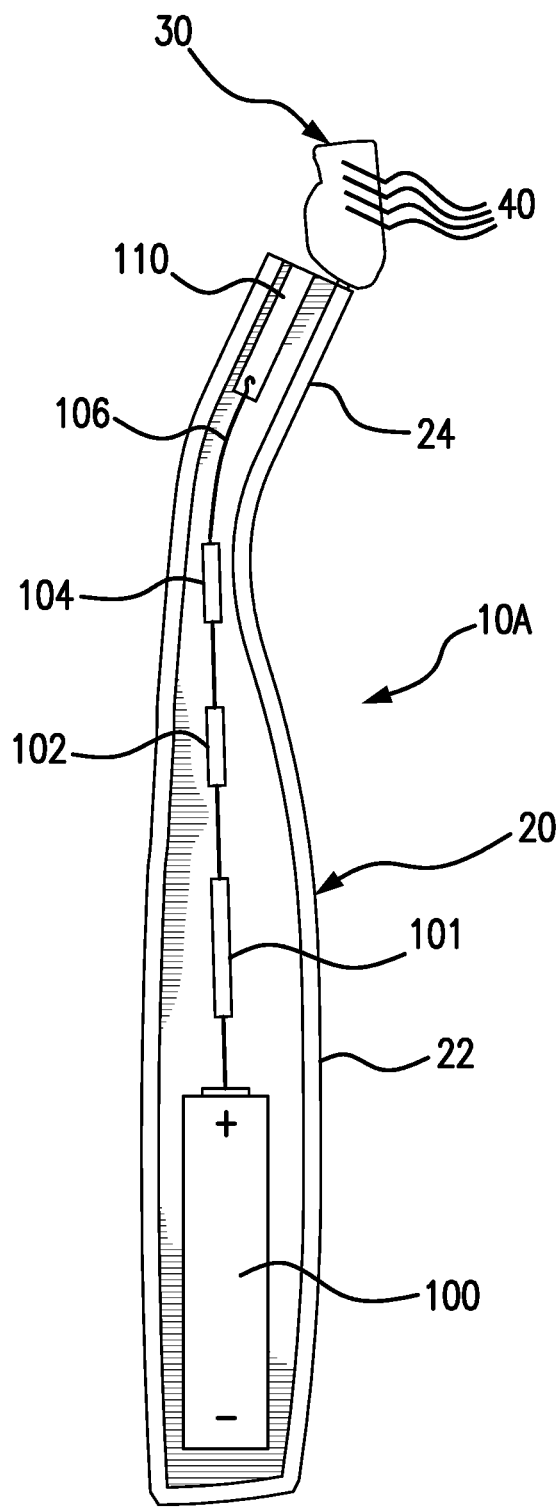
FIG. 1 is a schematic diagram of a razor in accordance with one embodiment of the invention, and illustrating the primary components therein.

Referring initially to FIG. 1, a first embodiment of the invention is shown. The embodiment of FIG. 1 is directed to a razor 10A having one or more blades 40 that are directly heated by RF energy. The razor 10A includes a housing 20 formed and configured to provide a handle 22 and an integral neck portion 24. A blade cartridge 30 with the one or more blades 40 is connected to a distal end of the neck portion 24. As shown in FIG. 1, a control circuit 101 in the housing 20 of the razor is directly connected to, or bi-directionally coupled with high frequency (HF) generator 102 and high frequency power amplifier (HFPA) 104. The control circuit 101 operates the HF generator 102 which generates RF energy. The control circuit 101 also operates the HFPA 104 which amplifies the RF energy throughout a range of controllable power levels. More specifically, the control circuit 101 provides a plurality of control signals that are necessary to operate the HF generator 102 and the HFPA 104. These control signals include, but are not limited to, signals to control the following functions: Enable, Power Limit, and Modulation Frequency. In return, the control circuit 101 acquires a plurality of status signals back from the HF generator 102 and HFPA 104. These status signals include, but are not limited to, signals that indicate the following: PLL (Phase Locked Loop) Locked, Measured SWR (Standing Wave Ratio), Power Consumption, and Tuning Coefficient. An energy storage source 100 provides the electric current required for operating the control circuit 101, the HF generator 102 and the HFPA 104. In a preferred embodiment, the energy source 100 includes one or more batteries contained in the handle of the razor. The one or more batteries may be rechargeable.

Figure 2:
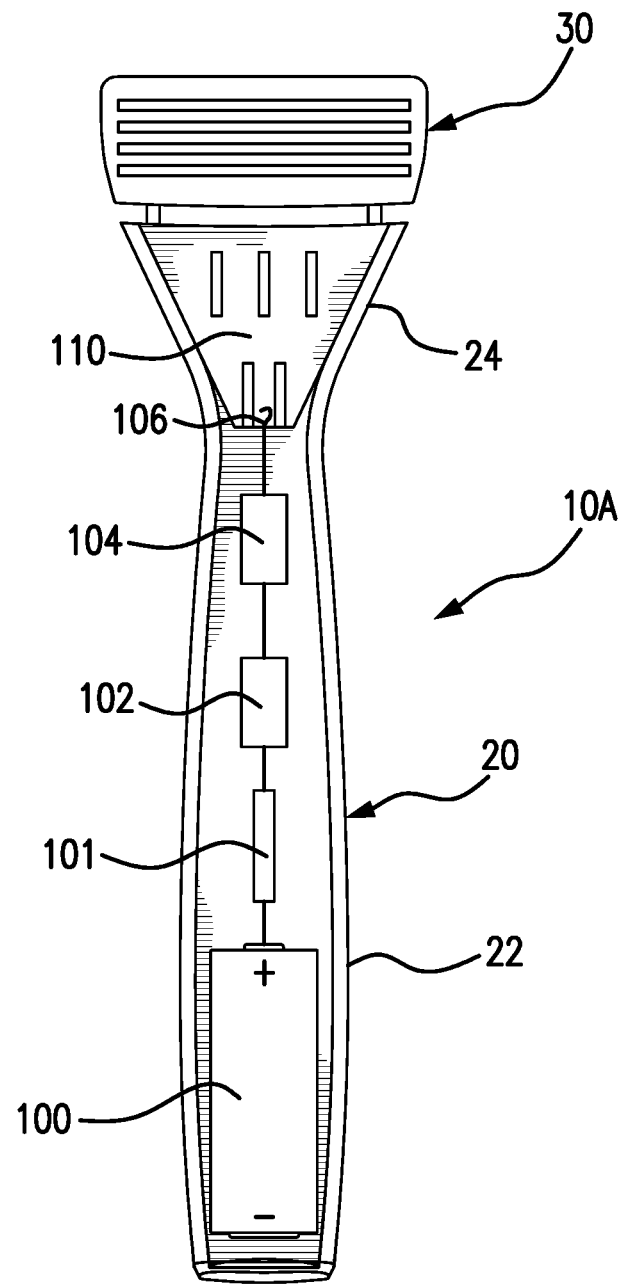
FIG. 2 is a schematic diagram of the razor of FIG. 1 further illustrating the internal components thereof.
Figure 3:
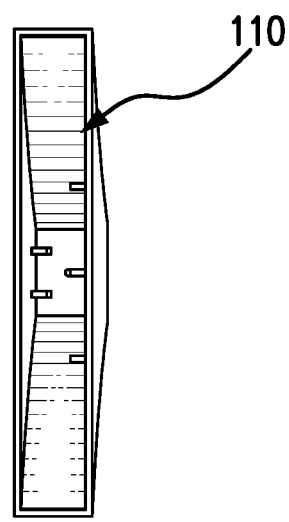
FIG. 3 is an isolated top perspective view of a resonance chamber of the razor of the present invention.
Figure 4:
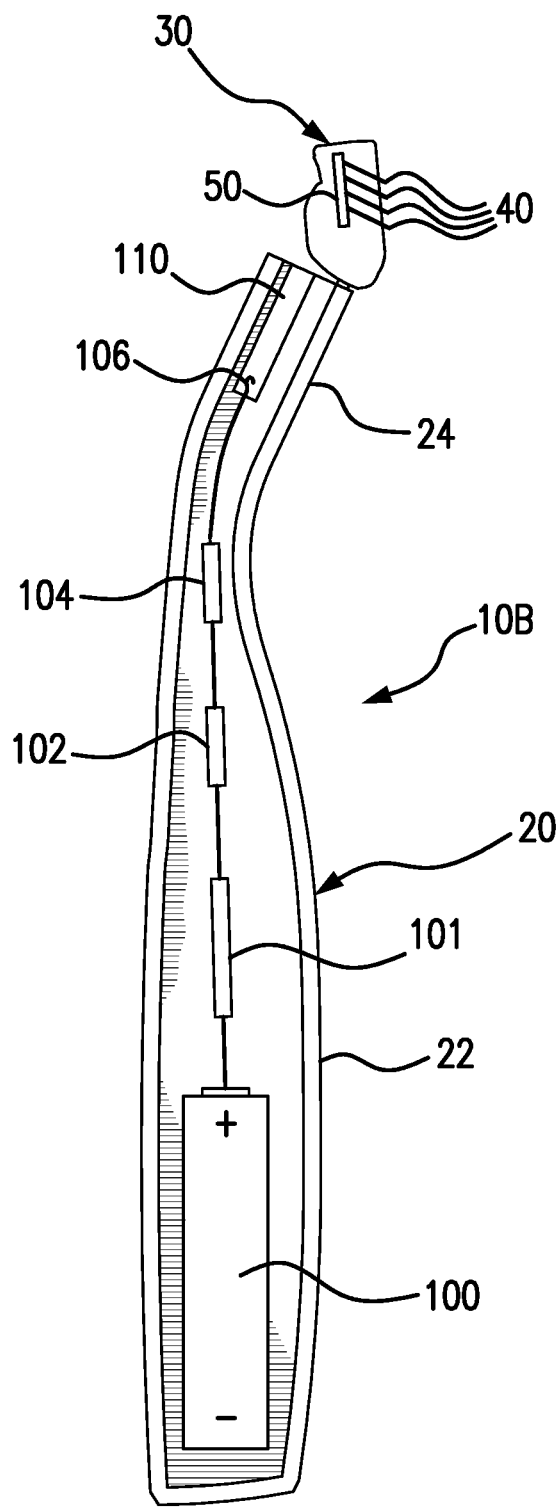
FIG. 4 is a schematic diagram of a razor in accordance with another embodiment of the present invention and illustrating the primary components.

Referring to FIGS. 1-2, the RF energy is guided from the HFPA 104 via a wave guide 106 into the resonance chamber 110 (i.e., band pass filter cavity), and is radiated from the resonance chamber towards the blades 40 that are made of material with a known Curie temperature. In at least one embodiment, the RF energy directed into the resonance chamber 110 is of a frequency ranging between 12 MHz and 15 MHz. The control circuit 101 measures the Standing Wave Ratio (SWR) and constantly monitors the SWR for changes. The SWR is determined according to the following formula:

$$SWR = \frac{1 + \sqrt{\frac{Pr}{Pf}}}{1 - \sqrt{\frac{Pr}{Pf}}}$$

Pr is reflected RF power—the power measurement of reflected (i.e., from the resonance chamber) RF signal.

Pf is forward RF power—the power measurement of forward (i.e., to the resonance chamber) RF signal.

As the blades 40 absorb HF energy, they heat up. As the temperature of the blades approaches the Curie temperature of the blade material, the electromagnetic properties are changed, thus changing the HF energy absorption rate, which in turn is indicated by a change in the SWR. In response, the control circuit 101 reduces the power of the generated RF energy. As the blades 40 are cooling down, thus moving further away from the Curie temperature, the HF energy absorption rate is increasing, which in turn is indicated by a changed SWR. In response, the control circuit increases the power of the generated RF energy, thereby maintaining the blades 40 at the desired temperature. For example, when water, skin and/or other elements come into contact with the blades 40, the temperature of the blades 40 inherently drifts away from the pre-set Curie temperature, which in turn increases the measured SWR, indicating to the control circuit 101 to increase the power limit to the HFPA 104, thus increasing the temperature of the blades 40 closer to the Curie temperature, at which point the process repeats. The control circuit 101 additionally monitors energy levels that are supplied by the electric power source 100 in order to estimate the power limit that is available for disposal.

Referring now to FIG. 2, a second embodiment of the invention is shown and is directed to a razor 10 having one or more blades 40 that are indirectly heated by RF energy.

The resonance chamber 110 directs radiated RF energy onto one or more heating elements 50 that are spaced from the resonance chamber 110. The one or more heating elements 50 have a pre-set or known Curie temperature. The one or more heating elements 50 are thermally coupled with the one or more blades 40, thus transferring heat energy directly to blades 40 of the razor. The electric power storage source 100 provides the electric current that is required for operating the control circuit 101, the HP generator 102 and the HFPA 104. The SWR is monitored for changes. As the heating element(s) 50 absorbs HF energy, it heats up. As the temperature of the heating element(s) 50 approaches the Curie temperature of the blade material, the electromagnetic properties are changed, thus changing the HF energy absorption rate, which in turn is indicated by a changed SWR. In response, the control circuit 101 reduces the power of the generated RF energy. As the heating element(s) 50 is cooling down, thus moving further away from the Curie temperature, the HF energy absorption rate is increasing, which in turn is indicated by a changed SWR. In response, the control circuit increases the power of the generated RF energy, thereby maintaining the heating element, and by extent the blades, at the desired temperature.

In further embodiments of the invention, the blades 40 may include a ceramic material on at least one surface of the blades (e.g., on the bottom surface) to enhance RF energy absorption and heating of the blades. An example of a ceramic material is gallium (Ga) based ceramic which may include gallium and arsenic (GaAs) or gallium and indium (GaIn).

While the present invention has been shown and described in accordance with several preferred and practical embodiments, it is recognized that departures from the instant disclosure are fully contemplated within the spirit and scope of the invention which is limited only by the following claims as interpreted under the Doctrine of Equivalents.

What is claimed is:

1. A razor for shaving and comprising:
   a housing including a handle and a neck portion;
   a blade cartridge connected to the neck portion and including at least one blade;
   a control circuit contained within the housing;
   a high frequency generator contained within the housing and operated by the control circuit for generating radio frequency energy;
   a high frequency power amplifier contained within the housing and operated by the control circuit, and the high frequency power amplifier being structured for receiving the radio frequency energy from the high frequency generator and for amplifying the radio frequency energy throughout a range of controllable power levels;
   a wave guide for receiving the generated and amplified radio frequency energy; and
   a resonance chamber for receiving the amplified radio frequency from the wave guide and the resonance chamber being positioned in the neck portion of the razor housing and spaced from the blade cartridge and the at least one blade, and the resonance chamber being further structured and configured for directing the amplified radio frequency energy onto the at least one blade to cause the at least one blade to increase in temperature.

2. The razor as recited in claim 1 wherein the control circuit is structured and disposed for monitoring the temperature of the at least one blade and the control circuit being further structured and disposed for increasing a power limit to the high frequency generator and the high frequency power amplifier when the temperature of the at least one blade drifts below a predetermined temperature to thereby trigger generation of higher power levels of radio frequency energy from the high frequency power amplifier for emission from the resonance chamber to effectively increase the temperature of the at least one blade for maintaining the temperature of the at least one blade within a desired temperature range.

3. The razor as recited in claim 2 wherein the razor includes a plurality of blades.

4. The razor as recited in claim 3 wherein the resonance chamber is structured and configured for directing the amplified radio frequency energy onto the plurality of blades to cause an increase in temperature of the plurality of blades.

5. A razor for shaving and comprising:
   a housing including a handle and a neck portion;
   a blade cartridge connected to the neck portion and including at least one blade;
   at least one heating element thermally coupled to the at least one blade;
   a control circuit contained within the housing;
   a high frequency generator contained within the housing and operated by the control circuit for generating radio frequency energy;
   a high frequency power amplifier contained within the housing and operated by the control circuit, and the high frequency power amplifier being structured for receiving the radio frequency energy from the high frequency generator and for amplifying the radio frequency energy throughout a range of controllable power levels;
   a wave guide for receiving the generated and amplified radio frequency energy; and
   a resonance chamber for receiving the amplified radio frequency from the wave guide and the resonance chamber being positioned in the neck portion of the razor housing and spaced from the blade cartridge and the at least one blade, and the resonance chamber being further structured and configured for directing the amplified radio frequency energy onto the at least one heating element to cause the at least one heating element to increase in temperature, and the at least one blade being caused to increase in temperature via the thermal coupling to the at least one heating element.

* * * * *